United States Patent
Cheng et al.

(10) Patent No.: US 12,507,472 B2
(45) Date of Patent: Dec. 23, 2025

(54) METHOD OF MAKING POLYSILICON STRUCTURE INCLUDING PROTECTIVE LAYER

(71) Applicant: TAIWAN SEMICONDUCTOR MANUFACTURING COMPANY, LTD., Hsinchu (TW)

(72) Inventors: Yu-Shao Cheng, Hsinchu (TW);
Chui-Ya Peng, Hsinchu (TW);
Kung-Wei Lee, Hsinchu (TW);
Shin-Yeu Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/521,404

(22) Filed: Nov. 28, 2023

(65) Prior Publication Data

US 2024/0096884 A1    Mar. 21, 2024

Related U.S. Application Data

(60) Continuation of application No. 17/205,579, filed on Mar. 18, 2021, now Pat. No. 11,855,086, which is a
(Continued)

(51) Int. Cl.
*H01L 21/3205*    (2006.01)
*H01L 21/02*    (2006.01)
(Continued)

(52) U.S. Cl.
CPC ....... *H10D 84/85* (2025.01); *H01L 21/02164* (2013.01); *H01L 21/0228* (2013.01);
(Continued)

(58) Field of Classification Search
CPC .......... H01L 29/33553; H01L 29/6656; H01L 21/32055; H01L 21/28247;
(Continued)

(56) References Cited

U.S. PATENT DOCUMENTS 4,577,390 A    3/1986 Haken
4,961,820 A    10/1990 Shingawa et al.
(Continued)

OTHER PUBLICATIONS

Dhong et al., "Sidewall Spacer Technology for MOS and Bipolar Devices", J. Electrochem. Soc. 1986 vol. 133, issue 2, 389-396, p. 394.

*Primary Examiner* — John A Bodnar
(74) *Attorney, Agent, or Firm* — Hauptman Ham, LLP

(57) ABSTRACT

A method of making a semiconductor device includes forming a first polysilicon structure over a first portion of a substrate. The method further includes forming a first spacer on a sidewall of the first polysilicon structure, wherein the first spacer has a concave corner region between an upper portion and a lower portion. The method further includes forming a protective layer covering an entirety of the first spacer and the first polysilicon structure, wherein the protective layer has a first thickness over the concave corner region and a second thickness over the first polysilicon structure, and a difference between the first thickness and the second thickness is at most 10% of the second thickness.

20 Claims, 4 Drawing Sheets

Related U.S. Application Data continuation of application No. 16/101,784, filed on Aug. 13, 2018, now Pat. No. 10,957,697, which is a division of application No. 14/158,239, filed on Jan. 17, 2014, now Pat. No. 10,050,035.

(51) Int. Cl.

| | | |
|---|---|---|
| *H01L 21/28* | (2025.01) | |
| *H01L 21/311* | (2006.01) | |
| *H01L 21/8222* | (2006.01) | |
| *H01L 21/8238* | (2006.01) | |
| *H01L 27/06* | (2006.01) | |
| *H01L 29/66* | (2006.01) | |
| *H01L 29/78* | (2006.01) | |
| *H10B 10/00* | (2023.01) | |
| *H10B 20/25* | (2023.01) | |
| *H10D 10/01* | (2025.01) | |
| *H10D 30/01* | (2025.01) | |
| *H10D 30/64* | (2025.01) | |
| *H10D 64/01* | (2025.01) | |
| *H10D 84/01* | (2025.01) | |
| *H10D 84/03* | (2025.01) | |
| *H10D 84/40* | (2025.01) | |
| *H10D 84/85* | (2025.01) | |

(52) U.S. Cl.
CPC .. *H01L 21/28247* (2013.01); *H01L 21/31111* (2013.01); *H01L 21/31116* (2013.01); *H01L 21/32051* (2013.01); *H01L 21/32055* (2013.01); *H10B 10/00* (2023.02); *H10B 20/25* (2023.02); *H10D 10/01* (2025.01); *H10D 30/028* (2025.01); *H10D 30/64* (2025.01); *H10D 64/015* (2025.01); *H10D 84/0112* (2025.01); *H10D 84/0165* (2025.01); *H10D 84/0179* (2025.01); *H10D 84/0184* (2025.01); *H10D 84/038* (2025.01); *H10D 84/401* (2025.01)

(58) Field of Classification Search
CPC ............. H10D 84/0184; H10D 64/021; H10D 84/038; H10D 64/015; H10D 84/85
See application file for complete search history.

(56) References Cited

U.S. PATENT DOCUMENTS

| | | | |
|---|---|---|---|
| 5,314,845 | A | 5/1994 | Lee et al. |
| 5,378,659 | A | 1/1995 | Roman et al. |
| 5,625,212 | A | 4/1997 | Fukumoto |
| 6,146,925 | A | 11/2000 | Dennison |
| 6,218,235 | B1 | 4/2001 | Hachisuka et al. |
| 6,392,275 | B1 | 5/2002 | Jang |
| 6,424,011 | B1 | 7/2002 | Assaderaghi |
| 6,599,795 | B2 | 7/2003 | Ogata |
| 6,610,577 | B1 | 8/2003 | Thomas et al. |
| 6,770,927 | B2 | 8/2004 | Cho et al. |
| 7,256,113 | B1 | 8/2007 | Hellig et al. |
| 8,367,493 | B1 | 2/2013 | Ngo et al. |
| 8,716,104 | B1 | 5/2014 | Zhang et al. |
| 9,019,741 | B2 | 4/2015 | Lin |
| 9,318,571 | B2 * | 4/2016 | Wang .................. H01L 29/6653 |
| 2002/0019090 | A1 | 2/2002 | Ogata et al. |
| 2002/0052128 | A1 | 5/2002 | Yu et al. |
| 2002/0123181 | A1 | 9/2002 | Hachisuka |
| 2002/0182795 | A1 | 12/2002 | Bae et al. |
| 2004/0065958 | A1 | 4/2004 | Hachisuka et al. |
| 2004/0262784 | A1 * | 12/2004 | Doris .................. H10D 64/021 257/314 |
| 2005/0048750 | A1 | 3/2005 | Kim |
| 2008/0096337 | A1 * | 4/2008 | Tigelaar ............. H10D 84/0147 257/E21.64 |
| 2008/0128823 | A1 * | 6/2008 | Takeoka ............ H01L 21/76825 257/E21.632 |
| 2008/0164531 | A1 | 7/2008 | Jawarani et al. |
| 2009/0174385 | A1 | 7/2009 | Yen et al. |
| 2010/0068875 | A1 | 3/2010 | Yeh et al. |
| 2012/0196421 | A1 * | 8/2012 | Chang ................ H01L 29/6653 438/303 |
| 2013/0115763 | A1 | 5/2013 | Takamure et al. |

\* cited by examiner

METHOD OF MAKING POLYSILICON STRUCTURE INCLUDING PROTECTIVE LAYER

PRIORITY CLAIM

The present application is a continuation of U.S. application Ser. No. 17/205,579, filed Mar. 18, 2021, now U.S. Pat. No. 11,855,086, issued Dec. 26, 2023, which is a continuation of U.S. application Ser. No. 16/101,784 filed Aug. 13, 2018, now U.S. Pat. No. 10,957,697, issued Mar. 23, 2021, which is a divisional of U.S. application Ser. No. 14/158,239, filed Jan. 17, 2014, now U.S. Pat. No. 10,050,035, issued Aug. 14, 2018, which are incorporated herein by reference in their entireties.

BACKGROUND

In some applications, a logic circuit, static random access memory (SRAM), and one-time-programmable (OTP) memory of an integrated circuit are fabricated on the same substrate. In some applications, when performing a self-aligned silicide (salicide) process to form electrical contacts on the logic or SRAM part, the OTP part of the integrated circuit is protected by a protective layer. The performance of the logic circuit, the SRAM, and the OTP memory is affected by the thickness of the protective layer in the OTP part and residue of materials used to form the protective layer in the SRAM part.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
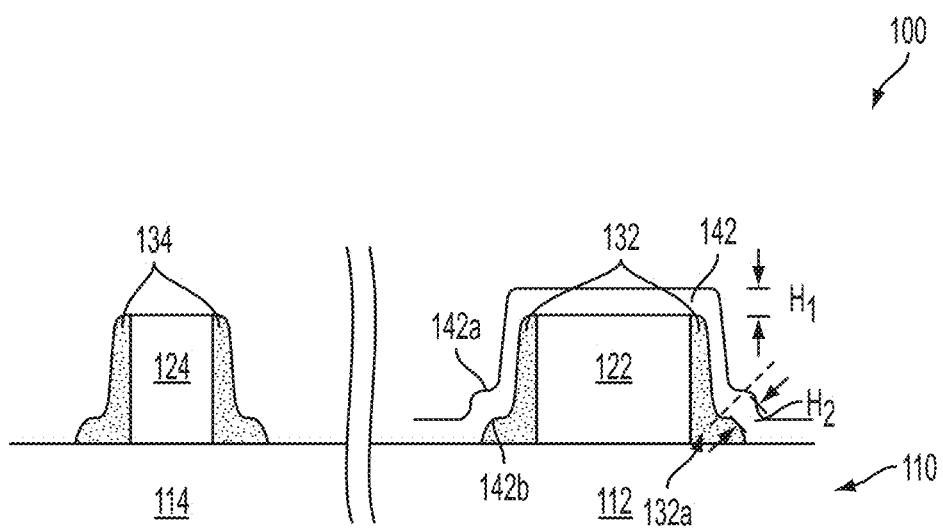
FIG. 1 is a cross-sectional view of an integrated circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

By forming a layer of protective material that is sufficiently thick and yet conformal to a contour of a polysilicon structure and corresponding spacers of an integrated circuit, a process window of a subsequent removal process is enlarged compared to a non-conformal layer of protective material. As a result, the integrated circuit has a better silicide formation in the logic or SRAM part and better leakage prevention in the OTP part. In some embodiments, the disclosed embodiments are suitable to be used in a Bipolar-CMOS-DMOS (BCD) process. Bipolar stands for bipolar junction transistors, CMOS stands for complementary metal-oxide-semiconductor transistors, and DMOS stands for double-diffused metal-oxide-semiconductor transistors.

FIG. 1 is a cross-sectional view of an integrated circuit 100 in accordance with some embodiments. In some embodiments, integrated circuit 100 depicted in FIG. 1 is an intermediate product, which will be further processed by one or more manufacturing processes in order to form a functional integrated circuit. Other active electrical components and passive electrical components of the integrated circuit 100 are not shown in FIG. 1.

Integrated circuit 100 has a substrate 110, a first polysilicon structure 122, a second polysilicon structure 124, a first set of spacers 132, a second set of spacers 134, and a protective layer 142.

In some embodiments, substrate 110 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, substrate 110 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, substrate 110 is a semiconductor on insulator. In some examples, substrate 110 includes an epitaxial layer or a buried layer. In other examples, substrate 110 includes a multilayer compound semiconductor structure.

In some embodiments, substrate 110 generally exhibits a conductive characteristic similar to that of an intrinsic semiconductor material or a semiconductor material having a predetermined doping type. In some embodiments, the predetermined doping type is a P-type doping.

Substrate 110 has a first portion 112 and a second portion 114. In some embodiments, two or more of a logic circuit, a static random access memory (SRAM), or a one-time-programmable (OTP) memory are fabricated on substrate 110, where the OTP memory is formed on first portion 112 of substrate 110, and the logic circuit and/or the SRAM are formed on second portion 114 of substrate 110. In some embodiments, the logic circuits, SRAM, and OTP memory are fabricated using a bipolar-CMOS-DMOS (BCD) process. In other words, in some embodiments, at least one bipolar junction transistor (BJT) device, at least one complementary metal-oxide-semiconductor (CMOS) device, and at least one double-diffused metal-oxide-semiconductor (DMOS) device is formed on substrate 110.

First polysilicon structure 122 is over first portion 112 of substrate 110. First set of spacers 132 includes two spacers on opposite sidewalls of first poly silicon structure 122. Spacers 132 are L-shaped spacers. In some embodiments, spacers 132 have a shape other than an L-shape. In some embodiments, spacers 132 have a material including silicon nitride. In some embodiments, spacers 132 have a multi-layer structure. In some embodiments, integrated circuit 100 has a one-time-programmable (OTP) device that includes first polysilicon structure 122 and spacers 132. In some embodiments, a gate dielectric (not shown) is formed between polysilicon structure 122 and substrate 110. In some embodiments, one or more layers of other materials are formed between poly silicon structure 122 and substrate 110.

Second polysilicon structure 124 is over second portion 114 of substrate 110. Second set of spacers 134 includes two spacers on opposite sidewalls of second polysilicon structure 124. Spacers 134 are L-shaped spacers. In some embodiments, spacers 134 have a shape other than an L-shape. In some embodiments, spacers 134 have a material including silicon nitride. In some embodiments, spacers 134 have a multi-layer structure. In some embodiments, integrated circuit 100 has a logic circuit or an SRAM that includes second polysilicon structure 124 and spacers 134. In some embodiments, a gate dielectric (not shown) is formed between polysilicon structure 124 and substrate 110. In some embodiments, one or more layers of other materials are formed between poly silicon structure 124 and substrate 110.

In some embodiments, first and second polysilicon structure 122 and 124 are concurrently formed and include similar materials. In some embodiments, first and second set of spacers 132 and 134 are concurrently formed and include similar configuration and materials.

Protective layer 142 covers first portion 112 of substrate 110, first polysilicon structure 122, and first set of spacers 132. Protective layer 142 is free from covering second portion 114 of substrate 110, second polysilicon structure 124, and second set of spacers 134. A thickness of protective layer 142 is measureable as a distance between an upper surface 142a and a lower surface 142b of protective layer 142 along a normal direction of the lower surface 142b of protective layer 142. Protective layer 142 having a thickness $H_1$ over first polysilicon structure 122, and the thickness $H_1$ is equal to or greater than 500 Å. In some embodiments, thickness $H_1$ represents the maximum thickness of protective layer 142 directly over first polysilicon structure 122. Protective layer 142 having a thickness $H_2$ over spacers 132, and the thickness $H_2$ is equal to or less than 110% of the first thickness $H_1$. In some embodiments, thickness $H_2$ represents the maximum thickness of protective layer 142 directly over spacers 132. In some embodiments, the maximum thickness of protective layer 142 over spacers 132 occurs at about a corner portion 132a of the spacers 132.

Protective layer 142 thus provides sufficient protection to first polysilicon structure 122 while second polysilicon structure 124 is being processed by a silicide process. Also, the difference between thickness $H_2$ and thickness $H_1$ is small enough (equal to or less than 10% of thickness $H_1$) that eases a requirement for the processing window for a subsequent protective layer removal process.

Figure 2:
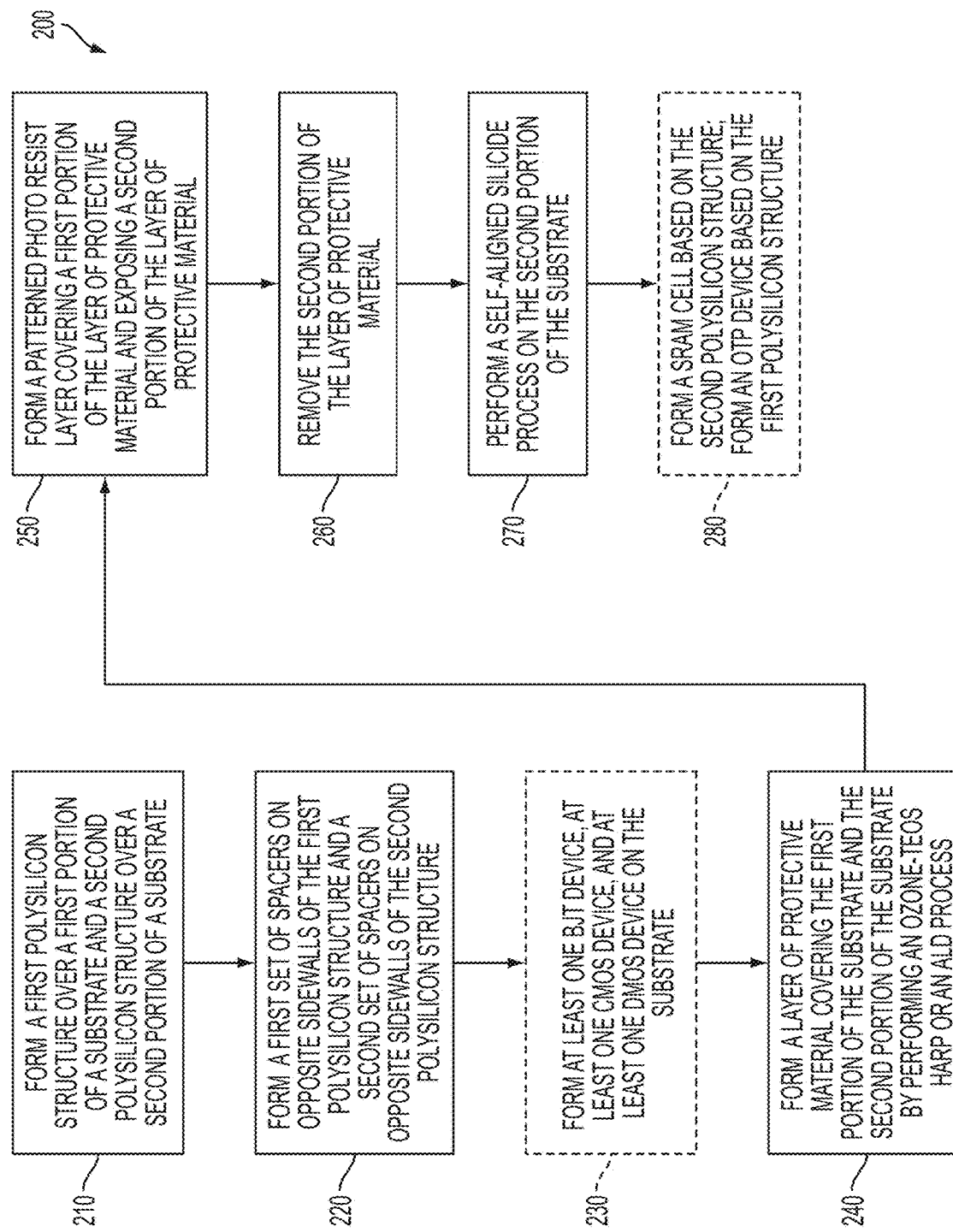
FIG. 2 is a flow chart of a method of fabricating an integrated circuit in accordance with some embodiments.
Figure 3A:
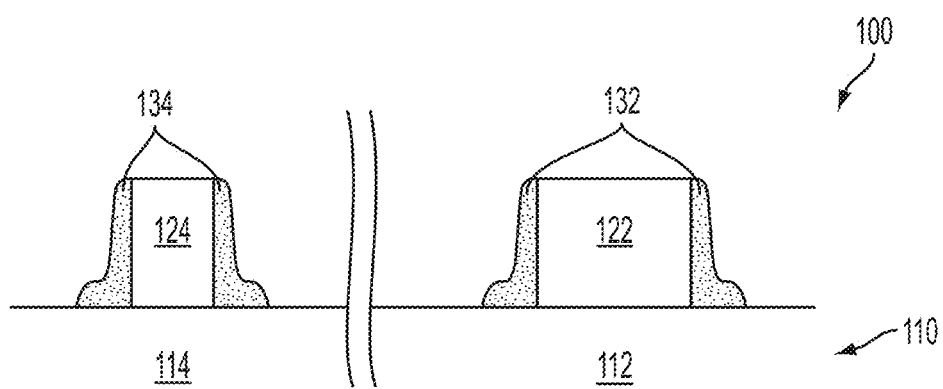
FIGS. 3A to 3C are cross-sectional views of an integrated circuit at various manufacturing stages in accordance with some embodiments.
Figure 3B:
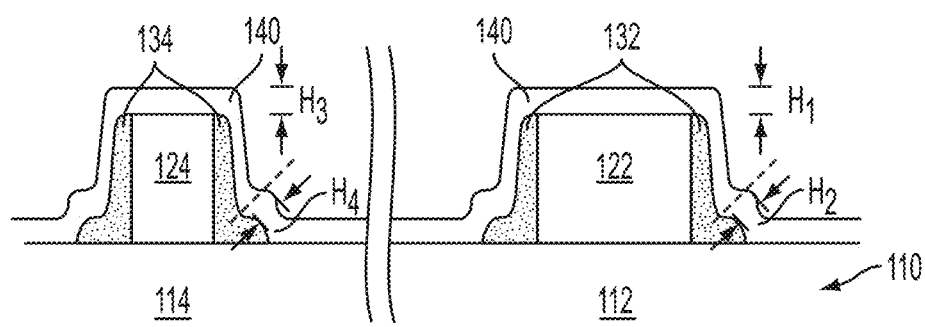
Figure 3C:
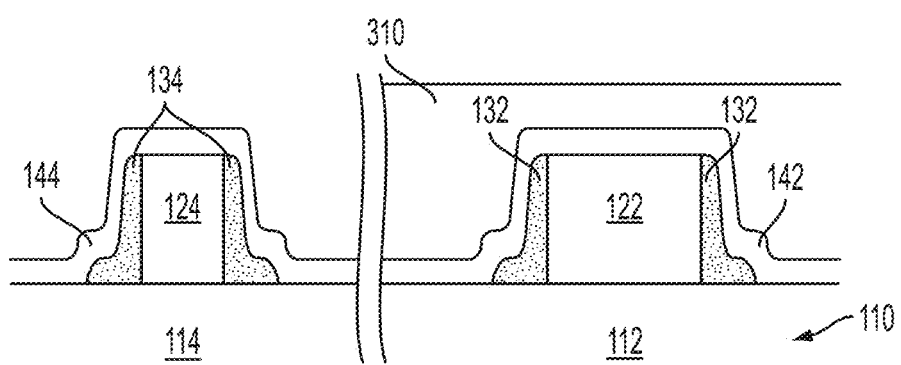

FIG. 2 is a flow chart of a method 200 of fabricating an integrated circuit 100 in accordance with some embodiments. FIGS. 3A to 3C are cross-sectional views of integrated circuit 100 at various manufacturing stages in accordance with some embodiments. Components in FIGS. 2 and 3A to 3C that are the same or similar to those in FIG. 1 are given the same reference numbers, and detailed description thereof is omitted. It is understood that additional operations may be performed before, during, and/or after the method 200 depicted in FIG. 2, and that some other processes may only be briefly described herein.

As depicted in FIG. 2 and FIG. 1, the process 200 begins at operation 210, where first polysilicon structure 122 is formed over first portion 112 of substrate 110 and second polysilicon structure 124 is formed over second portion 114 of substrate 110. In some embodiments, operation 210 includes forming a layer of polysilicon material over substrate 110 and then patterning the layer of poly silicon material into first and second polysilicon structures 122 and 124 by performing a lithographic process followed by a removal process.

The process 200 proceeds to operation 220, where first set of spacers 132 and second set of spacers 134 are formed on sidewalls of polysilicon structure 122 and 124. In some embodiments, operation 220 includes forming a layer of spacer material over first and second polysilicon structures 122 and 124 and substrate 110 and then patterning the layer of spacer material into first and second sets of spacers 132 and 134 by performing a removal process. In some embodiments, the layer of spacer material includes silicon nitride. In some embodiments, the removal process includes an anisotropic etch process.

FIG. 3A is a cross-sectional view of integrated circuit 100 after operation 220.

As depicted in FIG. 2 and FIG. 1, the process 200 proceeds to operation 230, where one or more other electrical components are also formed on substrate 110. In some embodiments, integrated circuit 100 is fabricated by a BCD process, and operation 230, in conjunction with operations 210 and/or 220, are usable to form at least one bipolar junction transistor (BJT), at least one complementary metal-oxide-semiconductor (CMOS) device, and at least one double-diffused metal-oxide-semiconductor (DMOS) device on substrate 110. In some embodiments, operation 230 is performed before, after, or concurrently with operations 210 and 220. In some embodiments, operation 230 is omitted.

The process 200 proceeds to operation 240, where a layer of protective material is formed over substrate 110. In some embodiments, the layer of protective material includes silicon oxide, and operation 240 includes performing an ozone-tetraethyl orthosilicate (TEOS) high aspect ratio process (HARP) or an atomic layer deposition (ALD) process. In some embodiments, the ozone-TEOS HARP process or the ALD process is suable to form a layer of protective material that is conformal to a contour of polysilicon structure 122 and 124 and corresponding spacers 132 and 134 of an integrated circuit 100, even when the thickness of the layer of protective material over polysilicon structure 122 and 124 is equal to or greater than 500 Å.

FIG. 3B is a cross-sectional view of integrated circuit 100 after operation 240. A layer of protective material 140 covers the first and second polysilicon structures 122 and 132 and first and second sets of spacers 132 and 134.

The layer of protective material 140 has a thickness $H_1$ over first polysilicon structure 122, and the thickness $H_1$ is equal to or greater than 500 Å. In some embodiments, thickness $H_1$ represents the maximum thickness of the layer of protective material 140 over first polysilicon structure 122. The layer of protective material 140 having a thickness $H_2$ over spacers 132, and the thickness $H_2$ is equal to or less than 110% of the first thickness $H_1$. In some embodiments, thickness $H_2$ represents the maximum thickness of the layer of protective material 140 over spacers 132.

Also, the layer of protective material 140 has a maximum thickness $H_3$ over second polysilicon structure 124, and the maximum thickness $H_3$ is equal to or greater than 500 Å. The layer of protective material 140 having a maximum thickness $H_4$ over spacers 134, and the thickness $H_4$ is equal to or less than 110% of the thickness $H_3$. In some embodiments, the difference between thickness $H_4$ and thickness $H_3$ is small enough (e.g., equal to or less than 10% of thickness $H_3$) that eases a requirement for the processing window for one or more subsequent protective layer removal processes.

As depicted in FIG. 2 and FIG. 1, the process 200 proceeds to operation 250, where a patterned photo resist layer is formed over a portion of the layer of protective material 140 and the first portion of substrate 112.

FIG. 3C is a cross-sectional view of integrated circuit 100 after operation 250. A patterned photo resist layer 310 is formed to cover a first portion 142 of the layer of protective material 140 that covers the first portion 112 of the substrate 110 and to expose a second portion 144 of the layer of protective material 140 that covers the second portion 114 of the substrate 110.

As depicted in FIG. 2, FIG. 1, and FIG. 3C, the process 200 proceeds to operation 260, where the second portion 144 of the layer of protective material 140 is removed. In some embodiments, operation 260 includes performing a dry etch process or a wet etch process, or a combination thereof. In some embodiments, operation 260 includes performing a dry etch process and then performing a wet etch process after the performing the dry etch process. After operation 260, patterned photo resist layer 310 is removed by an ashing process.

Because the layer of protective material 140 is conformally formed along a contour of polysilicon structure 124 and spacers 134, the process window for the dry etch process is sufficient large for yield control, and the process window for the wet etch process is sufficient large for protective layer peeling prevention.

FIG. 1 depicts a cross-sectional view of integrated circuit 100 after operation 260.

As depicted in FIG. 2, the process 200 proceeds to operation 270, where a self-aligned silicide (salicide) process is performed on the second portion 114 of the substrate 110 while the first portion 112 of the substrate 110 is covered by the first portion 142 of the layer of protective material. The process 200 then proceeds to operation 280, where a logic circuit or an SRAM cell is formed based on the second polysilicon structure 124 and spacers 134, and an OTP device is formed based on first polysilicon structure 122 and spacers 132. In some embodiments, operation 280 is omitted, and polysilicon structures 122 and 124 are used to form other types of electrical components.

Figure 4:
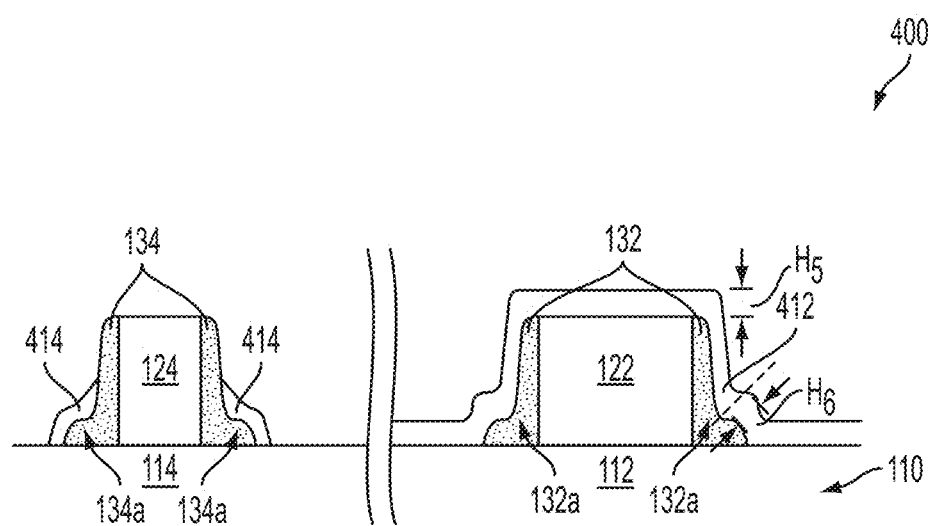
FIG. 4 is a cross-sectional view of an integrated circuit that is fabricated by a process different from that depicted in FIG. 2 in accordance with some embodiments.

FIG. 4 is a cross-sectional view of an integrated circuit 400 that is fabricated by a process different from that depicted in FIG. 2 in accordance with some embodiments. Components in FIG. 4 that are the same or similar to those in FIG. 1 are given the same reference numbers, and detailed description thereof is omitted.

Integrated circuit 400 includes a protective layer 412 over first polysilicon structure 122, first set of spacers 132, and first portion 112 of substrate 110. Integrated circuit 400 further includes residue protective materials 414 near the corner portion 134a of second set of spacers 134 of and extending to an upper surface of second portion 114 of substrate 110.

Compared with integrated circuit 100, a processing operation comparable to operation 240 for manufacturing integrated circuit 400 is performed by a Plasma-enhanced chemical vapor deposition (PECVD) process. The PECVD process causes accumulation of protective materials at corner portions 132a and 134a. As a result, when a thickness $H_5$ of protective layer 412 over first polysilicon structure 122 is equal to or greater than 500 Å, a thickness $H_6$ of protective layer 412 around corner portion 132a of first set of spacers 132 is greater than 110% of thickness $H_5$. In some embodiments, thickness $H_6$ of protective layer 412 is greater than 120% of thickness $H_5$.

At a stage comparable to FIG. 3C, second polysilicon structure 122 of integrated circuit 400 is covered by a layer of protective material in a manner similar to protective layer 412 over first silicon structure 122. The difference between thickness $H_6$ and thickness $H_5$ is too large (greater than 10% of thickness $H_5$) that renders a requirement for the processing window for a subsequent protective layer removal process more stringent than that of operation 260 or technically infeasible. As a result, residue protective materials 414 near the corner portion 134a of second set of spacers 134 are not fully removed.

In some embodiments, residue protective materials 414 hinder a subsequent silicidation process comparable to operation 270. In some embodiments, in order to reduce or eliminate residue protective materials 414, protective layer 412 becomes too thin to effectively protect polysilicon structure 122 from the subsequent silicidation process intended for polysilicon structure 124 and/or second portion of substrate 114.

An aspect of this description relates to a method of making a semiconductor device. The method includes forming a first polysilicon structure over a first portion of a substrate. The method further includes forming a first spacer on a sidewall of the first polysilicon structure, wherein the first spacer has a concave corner region between an upper portion and a lower portion. The method further includes forming a protective layer covering an entirety of the first spacer and the first polysilicon structure, wherein the protective layer has a first thickness over the concave corner region and a second thickness over the first polysilicon structure, and a difference between the first thickness and the second thickness is at most 10% of the second thickness. In some embodiments, forming the protective layer includes forming the protective layer having the second thickness be 500 Angstroms or greater. In some embodiments, forming the protective layer includes forming the protective layer over a second polysilicon structure over a second portion of the substrate. In some embodiments, forming the protective layer includes forming the protective layer as a continuous layer over the first polysilicon structure and the second poly silicon structure. In some embodiments, the method further includes removing the protective layer from a top surface of the second polysilicon structure. In some embodiments, removing the protective layer from the top surface of the second polysilicon structure includes maintaining the protective layer over the first polysilicon structure. In some embodiments, forming the first spacer includes forming the first spacer having a uniform composition throughout the first spacer.

An aspect of this description relates to a method of making a manufacture. The method includes forming a polysilicon structure over a portion of a substrate. The method further includes forming a spacer on a sidewall of the polysilicon structure, wherein the spacer has a concave corner region between an upper portion and a lower portion, the spacer has an outer sidewall and an inner sidewall, and the inner sidewalls is between the outer sidewall and the polysilicon structure. The method further includes forming a protective layer exposing a portion of the outer sidewall of each of the two spacers above the concave corner region, wherein the protective layer covers an entirety of the lower portion of the spacer. In some embodiments, forming the spacer includes forming the spacer having a same height at the polysilicon structure. In some embodiments, forming the spacer includes forming the spacer having a uniform composition. In some embodiments, forming the protective layer includes depositing the protective layer as a continuous layer over the polysilicon structure and a second polysilicon structure. In some embodiments, forming the protective layer further includes removing the protective layer from the upper portion of the spacer and from over the polysilicon structure. In some embodiments, forming the protective layer further includes maintaining the protective layer over the second polysilicon structure during removing the protective layer from the upper portion of the spacer. In some embodiments, forming the protective layer includes forming the protective layer in direct contact with the substrate.

An aspect of this description relates to a method of forming a semiconductor device. The method includes forming a first polysilicon structure over a first portion of a substrate. The method further includes forming a first spacer on a sidewall of the first polysilicon structure, wherein the first spacer has a first concave corner region between an upper portion and a lower portion. The method further includes forming a second polysilicon structure over a second portion of the substrate. The method further includes forming a second spacer on a sidewall of the second polysilicon structure, wherein the second spacer has a second concave corner region, the second spacer has an inner sidewall and an outer sidewall, and the inner sidewall is between the outer sidewall and the second polysilicon structure. The method further includes forming a first protective layer covering an entirety of the first spacer and the first polysilicon structure. The method further includes forming a second protective layer over the second concave corner region, wherein the second protective layer exposes a top-most portion of a sidewall of the second spacer. In some embodiments, forming the first protective layer and the second protective layer includes depositing a continuous protective layer over the first polysilicon structure and the second polysilicon structure; and removing a portion of the continuous protective layer from the second polysilicon structure to define the first protective layer and the second protective layer. In some embodiments, forming the first protective layer includes forming the first protective layer having a first thickness over a top surface of the first polysilicon structure and a second thickness over first concave corner region, and the first thickness is different from the second thickness. In some embodiments, forming the first protective layer includes forming the first protective layer having the second thickness be at least 110% of the first thickness. In some embodiments, forming the second protective layer includes forming the second protective layer directly contacting the substrate. In some embodiments, forming the second spacer includes forming the second spacer having a uniform composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
    forming a first polysilicon structure over a first portion of a substrate;
    forming a first spacer on a sidewall of the first polysilicon structure, wherein the first spacer has a concave corner region between an upper portion and a lower portion;
    forming a protective layer covering an entirety of the first spacer and the first polysilicon structure, wherein the protective layer has a first thickness over the concave corner region and a second thickness over the first polysilicon structure, and a difference between the first thickness and the second thickness is at most 10% of the second thickness; and
    removing the protective layer from a portion of the first spacer, wherein the protective layer has a second concave corner following removal from the portion of the first spacer.

2. The method of claim 1, wherein forming the protective layer comprises forming the protective layer having the second thickness be different from the first thickness.

3. The method of claim 1, wherein forming the protective layer comprises forming the protective layer over a second polysilicon structure over a second portion of the substrate.

4. The method of claim 3, wherein forming the protective layer comprises forming the protective layer as a continuous layer over the first polysilicon structure and the second polysilicon structure.

5. The method of claim 3, further comprising removing the protective layer from a top surface of the second polysilicon structure.

6. The method of claim 5, wherein removing the protective layer from the top surface of the second polysilicon structure comprises maintaining the protective layer over the first polysilicon structure.

7. The method of claim 1, wherein forming the first spacer comprises forming the first spacer having a uniform composition throughout the first spacer.

8. A method of making a manufacture, the method comprising:
    forming a polysilicon structure over a portion of a substrate;
    forming a spacer on a sidewall of the polysilicon structure, wherein the spacer has a concave corner region between an upper portion and a lower portion, the spacer has an outer sidewall and an inner sidewall, and the inner sidewall is between the outer sidewall and the polysilicon structure; and
    forming a protective layer exposing a portion of the outer sidewall of the spacer above the concave corner region, wherein the protective layer covers an entirety of the outer sidewall of the lower portion of the spacer, and the protective layer directly contacts the substrate.

9. The method of claim 8, wherein forming the spacer comprises forming the spacer having a same height at the polysilicon structure.

10. The method of claim 8, wherein forming the spacer comprises forming the spacer having a uniform composition.

11. The method of claim 8, wherein forming the protective layer comprises depositing the protective layer as a continuous layer over the polysilicon structure and a second polysilicon structure.

12. The method of claim 11, wherein forming the protective layer further comprises removing the protective layer from the upper portion of the spacer and from over the polysilicon structure.

13. The method of claim 12, wherein forming the protective layer further comprises maintaining the protective layer over the second polysilicon structure during removing the protective layer from the upper portion of the spacer.

14. The method of claim 8, wherein forming the protective layer comprises forming the protective layer having a second concave corner.

15. A method of forming a semiconductor device, the method comprising:
   forming a first polysilicon structure over a first portion of a substrate;
   forming a first spacer on a sidewall of the first polysilicon structure, wherein the first spacer has a first concave corner region between an upper portion and a lower portion;
   forming a second polysilicon structure over a second portion of the substrate;
   forming a second spacer on a sidewall of the second polysilicon structure, wherein the second spacer has a second concave corner region, the second spacer has an inner sidewall and an outer sidewall, and the inner sidewall is between the outer sidewall and the second polysilicon structure;
   forming a first protective layer covering an entirety of the first spacer and the first polysilicon structure; and
   forming a second protective layer over the second concave corner region, wherein the second protective layer exposes a top-most portion of the outer sidewall of the second spacer, and the second protection layer covers a bottommost portion of the outer sidewall of the second spacer.

16. The method of claim 15, wherein forming the first protective layer and the second protective layer comprises:
   depositing a continuous protective layer over the first polysilicon structure and the second polysilicon structure; and
   removing a portion of the continuous protective layer from the second polysilicon structure to define the first protective layer and the second protective layer.

17. The method of claim 15, wherein forming the first protective layer comprises forming the first protective layer having a first thickness over a top surface of the first polysilicon structure and a second thickness over first concave corner region, and the first thickness is different from the second thickness.

18. The method of claim 17, wherein forming the first protective layer comprises forming the first protective layer having the second thickness be at least 110% of the first thickness.

19. The method of claim 15, wherein forming the second protective layer comprises forming the second protective layer directly contacting the substrate.

20. The method of claim 15, wherein forming the second spacer comprises forming the second spacer having a uniform composition.

* * * * *